(12) United States Patent
Liang (10) Patent No.: US 9,301,395 B2
(45) Date of Patent: Mar. 29, 2016

(54) VOLTAGE NOISE REDUCTION THROUGH CO-LAYOUTS OF MULTILAYER CERAMIC CAPACITORS AND SOLID ELECTROLYTIC POLYMER CAPACITORS

(71) Applicant: NVIDIA Corporation, Santa Clara, CA (US)

(72) Inventor: Tiecheng Liang, Guangdong (CN)

(73) Assignee: NVIDIA Corporation, Santa Clara, CA (US)

( * ) Notice: Subject to any disclaimer, the term of this patent is extended or adjusted under 35 U.S.C. 154(b) by 527 days.

(21) Appl. No.: 13/728,385

(22) Filed: Dec. 27, 2012

(65) Prior Publication Data

US 2014/0185207 A1    Jul. 3, 2014

(51) Int. Cl.
| | |
|---|---|
| G06F 1/16 | (2006.01) |
| H05K 13/04 | (2006.01) |
| H05K 1/18 | (2006.01) |
| H05K 3/34 | (2006.01) |
| H05K 1/02 | (2006.01) |
| H01G 4/30 | (2006.01) |
| H01G 4/38 | (2006.01) |
| H01G 9/15 | (2006.01) |
| H01G 9/28 | (2006.01) |
| H01G 2/06 | (2006.01) |
| H01L 23/64 | (2006.01) |

(52) U.S. Cl.
CPC .............. *H05K 1/181* (2013.01); *H01G 2/06* (2013.01); *H01G 4/30* (2013.01); *H01G 4/38* (2013.01); *H01G 9/15* (2013.01); *H01G 9/28* (2013.01); *H05K 1/023* (2013.01); *H05K 3/341* (2013.01); *H01L 23/642* (2013.01); *H01L 2924/14* (2013.01); *H01L 2924/1432* (2013.01); *H01L 2924/1531* (2013.01); *H01L 2924/19041* (2013.01); *H01L 2924/19106* (2013.01); *H05K 1/0243* (2013.01); *H05K 2201/10015* (2013.01); *Y02P 70/611* (2015.11); *Y10T 29/4913* (2015.01)

(58) Field of Classification Search
USPC .......... 174/250, 255, 260, 262; 361/760, 763, 361/772, 782, 810, 811, 830, 523; 257/528, 257/532, 768, 777
See application file for complete search history.

(56) References Cited

U.S. PATENT DOCUMENTS

| | | | |
|---|---|---|---|
| 5,670,815 A | 9/1997 | Childs et al. | |
| 5,856,937 A * | 1/1999 | Chu et al. | ................ 365/51 |
| 6,400,576 B1 * | 6/2002 | Davidson | ........... H01L 23/642 174/262 |
| 6,778,390 B2 | 8/2004 | Michael | |
| 6,894,385 B1 | 5/2005 | Jafari et al. | |

(Continued)

*Primary Examiner* — Tremesha S Willis
*Assistant Examiner* — Michael E Moats, Jr.
(74) *Attorney, Agent, or Firm* — Zilka-Kotab, PC (57) ABSTRACT

Disclosed are methods and systems to reduce voltage noise on a printed circuit board (PCB) through a co-layout of multilayer ceramic capacitors. In one or more embodiments, this surface mounted layout comprises a first co-layout of multilayer ceramic capacitors mounted on a first corner of a rectangular footprint of a bottom side of the PCB; a second co-layout of multilayer ceramic capacitors mounted on a second corner of the rectangular footprint diagonal to the first corner; and a first solid electrolytic polymer capacitor and a second solid electrolytic polymer capacitor mounted on the remaining corners, respectively, of the rectangular footprint. The rectangular footprint of the PCB is a footprint of a high-speed processing unit mounted on the PCB. The high-speed processing unit is mounted on a top side of the PCB opposite the bottom side comprising the first co-layout of multilayer ceramic capacitors and the second co-layout of multilayer ceramic capacitors.

20 Claims, 6 Drawing Sheets

(56) References Cited

U.S. PATENT DOCUMENTS 7,616,445 B2 11/2009 Lin et al.
7,804,692 B2 9/2010 Lu
2004/0174807 A1 9/2004 Li

* cited by examiner

VOLTAGE NOISE REDUCTION THROUGH CO-LAYOUTS OF MULTILAYER CERAMIC CAPACITORS AND SOLID ELECTROLYTIC POLYMER CAPACITORS

FIELD OF TECHNOLOGY

This disclosure relates generally to printed circuit board technology, and more specifically, to systems and methods describing a surface mounted layout to reduce voltage noise carried by voltage supply lines on a printed circuit board.

BACKGROUND

With the increasing demand for realism and interactivity in graphics applications, high-speed processing units (such as high-speed graphics processing units) are obliged to handle increasingly complex image processing tasks. These high-speed processing units may comprise of an increasing number of circuit elements and, thus, consume significant amounts of power. The consumption of such power may lead to higher current draws over a short period of time and may lead to large and sudden voltage drops that may be harmful to the high-speed processing unit. In addition, the supply voltage rails that deliver power to the high-speed processing unit may carry electrical noise that may affect the performance of the high-speeding processing unit.

While different techniques have been used to place a bypass capacitor between power lines and ground lines to reduce voltage irregularities, such capacitors may often fail thermal specifications due to their positioning on a printed circuit board vis-à-vis the heat dissipating high-speed processing unit. Also, the limited space available on high-end printed circuit boards often compel board designers to choose electrical components that are not easily customizable or adaptable to new voltage noise problems that may arise from the introduction of new high-speed processing units to previously established printed circuit board layouts.

SUMMARY

Disclosed are methods and systems to reduce voltage noise on a printed circuit board through a surface mounted layout of multilayer ceramic capacitors and solid electrolytic polymer capacitors.

In one aspect, a surface mounted layout to reduce voltage noise on a printed circuit board, comprises a first co-layout of multilayer ceramic capacitors mounted on a first corner of a rectangular footprint of a bottom side of the printed circuit board, a second co-layout of multilayer ceramic capacitors mounted on a second corner of the rectangular footprint of the bottom side of the printed circuit board diagonal to the first corner, and a first solid electrolytic polymer capacitor and a second solid electrolytic polymer capacitor mounted on the remaining corners, respectively, of the rectangular footprint of the bottom side of the printed circuit board. The rectangular footprint of the printed circuit board is a footprint of a high-speed processing unit mounted on the printed circuit board. The high-speed processing unit is mounted on a top side of the printed circuit board opposite that of the bottom side comprising the first co-layout of multilayer ceramic capacitors and the second co-layout of multilayer ceramic capacitors. A set of leads of the first co-layout of multilayer ceramic capacitors, the first solid electrolytic polymer capacitor, the second co-layout of multilayer ceramic capacitors, and/or the second solid electrolytic polymer capacitor is coupled to a voltage supply pin and/or a ground pin of a voltage supply of the high-speed processing unit through a via.

The high-speed processing unit may be a central processing unit (CPU) and/or a graphics processing unit (GPU). The voltage supply of the high-speed processing unit may be a NVVDD and/or a core voltage of the high-speed processing unit. The rectangular footprint may be substantially a square having a side dimension between 20 and 35 mm. A set of thermal performance limitations for each of the multilayer ceramic capacitors may be between −55° C. and 125° C. and a set of thermal performance limitations for each of the first solid electrolytic polymer capacitor and the second solid electrolytic polymer capacitor may be between −40° C. and 105° C. In one aspect, each of the multilayer ceramic capacitors may have a capacitance of 10 µF. In another aspect, each of the multilayer ceramic capacitors may have a capacitance of 47 µF. The printed circuit board may be configured to be integrated into a computer graphics card, a mobile graphics card, a computer video adapter, a mobile video adapter, a computer graphics adapter, and/or a mobile graphics adapter.

In another aspect, an electronic assembly to reduce voltage noise comprises a first co-layout of multilayer ceramic capacitors surface mounted on a first corner of a rectangular footprint of a bottom side of the printed circuit board, a second co-layout of multilayer ceramic capacitors surface mounted on a second corner of the rectangular footprint of the bottom side of the printed circuit board diagonal to the first corner, and a first solid electrolytic polymer capacitor and a second solid electrolytic polymer capacitor surface mounted on the remaining corners, respectively, of the rectangular footprint of the bottom side of the printed circuit board. The rectangular footprint of the printed circuit board is a footprint of a high-speed processing unit mounted on the printed circuit board. The high-speed processing unit is surface mounted on a top side of the printed circuit board opposite that of the bottom side comprising the first co-layout of multilayer ceramic capacitors and the second co-layout of multilayer ceramic capacitors. A set of leads of the first co-layout of multilayer ceramic capacitors, the first solid electrolytic polymer capacitor, the second co-layout of multilayer ceramic capacitors, and/or the second solid electrolytic polymer capacitor is coupled to a voltage supply pin and/or a ground pin of a voltage supply of the high-speed processing unit through a via.

The high-speed processing unit may be a central processing unit (CPU) and/or a graphics processing unit (GPU). The voltage supply of the high-speed processing unit may be a NVVDD and/or a core voltage of the high-speed processing unit. The rectangular footprint may be substantially a square having a side dimension between 20 and 35 mm. A set of thermal performance limitations for each of the multilayer ceramic capacitors may be between −55° C. and 125° C. and a set of thermal performance limitations for each of the first solid electrolytic polymer capacitor and the second solid electrolytic polymer capacitor may be between −40° C. and 105° C. In one aspect, each of the multilayer ceramic capacitors may have a capacitance of 10 µF. In another aspect, each of the multilayer ceramic capacitors may have a capacitance of 47 µF. The printed circuit board may be configured to be integrated into a computer graphics card, a mobile graphics card, a computer video adapter, a mobile video adapter, a computer graphics adapter, and/or a mobile graphics adapter.

In yet another aspect, a method of assembling a printed circuit board to reduce voltage noise comprises surface mounting on a first corner of a rectangular footprint of a bottom side of the printed circuit board a first co-layout of multilayer ceramic capacitors, surface mounting on a second corner of the rectangular footprint of the bottom side of the printed circuit board diagonal to the first corner a second co-layout of multilayer ceramic capacitors, and surface mounting on the remaining corners, respectively, of the rectangular footprint of the bottom side of the printed circuit board a first solid electrolytic polymer capacitor and a second solid electrolytic polymer capacitor. The rectangular footprint of the printed circuit board is a footprint of a high-speed processing unit mounted on the printed circuit board. The high-speed processing unit is surface mounted on a top side of the printed circuit board opposite that of the bottom side comprising the first co-layout of multilayer ceramic capacitors and the second co-layout of multilayer ceramic capacitors. A set of leads of the first co-layout of multilayer ceramic capacitors, the first solid electrolytic polymer capacitor, the second co-layout of multilayer ceramic capacitors, and/or the second solid electrolytic polymer capacitor is coupled to a voltage supply pin and/or a ground pin of a voltage supply of the high-speed processing unit through a via. The voltage supply of the high-speed processing unit is a NVVDD and/or a core voltage of the high-speed processing unit.

The high-speed processing unit may be a central processing unit (CPU) and/or a graphics processing unit (GPU) and the rectangular footprint may be substantially a square having a side dimension between 20 and 35 mm. A set of thermal performance limitations for each of the multilayer ceramic capacitors may be between −55° C. and 125° C. and a set of thermal performance limitations for each of the first solid electrolytic polymer capacitor and the second solid electrolytic polymer capacitor may be between −40° C. and 105° C. and the multilayer ceramic capacitors may each have a capacitance of 47 μF. The printed circuit board may be configured to be integrated into a computer graphics card, a mobile graphics card, a computer video adapter, a mobile video adapter, a computer graphics adapter, and/or a mobile graphics adapter.

The methods, system, and/or apparatuses disclosed herein may be implemented in any means for achieving the various aspects. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements.

Other features of the present embodiments will be apparent from the accompanying drawings and from the detailed description that follows.

DETAILED DESCRIPTION

Disclosed are methods and systems to reduce voltage noise on a printed circuit board through a co-layout of multilayer ceramic capacitors. Although the present embodiments have been described with reference to specific example embodiments, it will be evident that various modifications and changes may be made to these embodiments without departing from the broader spirit and scope of the various embodiments.

Figure 1:
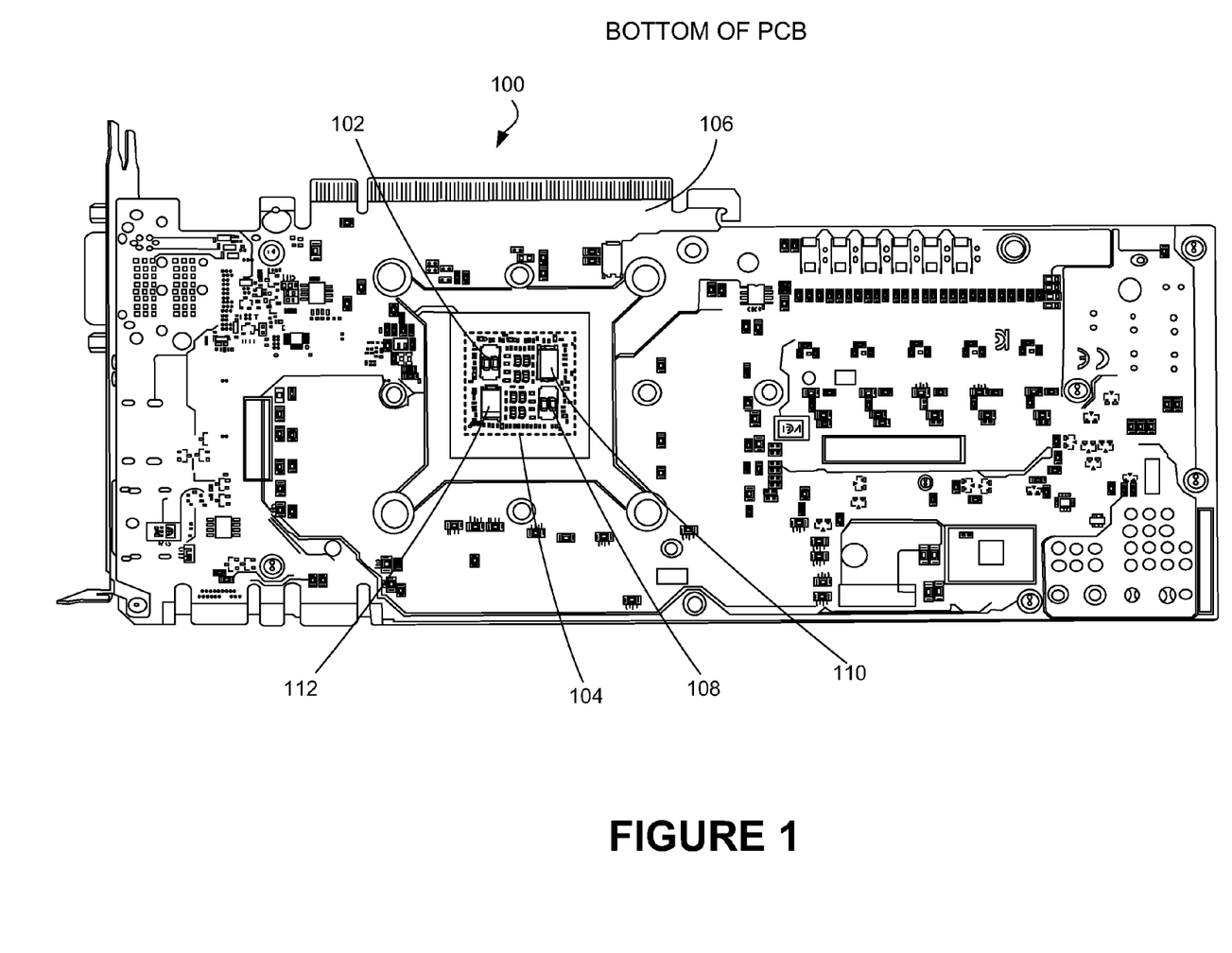
FIG. 1 depicts a bottom side of a printed circuit board comprising a surface mounted layout to reduce voltage noise, according to one embodiment.

Reference is now made to FIG. 1 which depicts a bottom side of a printed circuit board 100 comprising a surface mounted layout to reduce voltage noise, according to one or more embodiments. Such voltage noise may be the result of spurious oscillations carried by the voltage supply lines or because of interactions between the run-time behavior of software code and the innate characteristics of the underlying power delivery system. For example, parasitic inductance in the power system may cause voltages to fluctuate as current draws change with processor activity. Significant voltage overshoots can cause long-term damage to transistors and other components within an integrated circuit package.

In one embodiment, a surface mounted layout to reduce voltage noise on a printed circuit board 100 comprises a first co-layout of multilayer ceramic capacitors 102 mounted on a first corner of a rectangular footprint 104 of a bottom side 106 of the printed circuit board 100. A co-layout may refer to a functional layout on a printed circuit board where multiple board components (e.g., capacitors, inductors, etc.) are laid out in a substantially parallel configuration that may serve the same purpose as a singular board component of substantially the same functional characteristic. In this embodiment, the co-layout of multilayer ceramic capacitors 102 may refer to two multilayer ceramic capacitors arranged in tandem in substantially the same parallel configuration shown in FIG. 1. The multilayer ceramic capacitors may be surface mounted using typical reflow soldering techniques. It should be understood by one of ordinary skill in the art that a co-layout may also refer to any track routing and circuitry needed to achieve the co-layout described in the present embodiment.

Each of the multilayer ceramic capacitors may comprise of a thin layer of formulated ceramic dielectric sandwiched between metal electrodes alternately exposed on opposite edges of a laminated structure. Such multilayer ceramic capacitors may take the shape of a monolithic block and may comprise a nickel barrier layer and a tin overplate for ease of solderability. Each of the multilayer ceramic capacitors may also have thermal performance limitations (or thermal specifications) of between −55° C. and 125° C.

In this embodiment, the surface mounted layout also comprises a second co-layout of multilayer ceramic capacitors 108 mounted on a second corner of the rectangular footprint 104 of the bottom side 106 of the printed circuit board 100 diagonal to the first corner. In this embodiment, the second co-layout of multilayer ceramic capacitors may comprise of the same multilayer ceramic capacitors used to construct the first co-layout of multilayer ceramic capacitors 102. In the present embodiment, the second co-layout of multilayer ceramic capacitors 108 occupies a second corner of the rectangular footprint 104 that is diagonal to the first co-layout. The term "diagonal" may refer to a position that is directly diagonal to the first corner or substantially diagonal to the first corner. For example, as depicted in FIG. 1, the first co-layout of multilayer ceramic capacitors 102 may be surface mounted on a northwest corner of the rectangular footprint 104 and the second co-layout of multilayer ceramic capacitors 108 may be surface mounted on a southeast corner of the rectangular footprint 104. In another embodiment, the first co-layout of multilayer ceramic capacitors 102 may be surface mounted on a northeast corner of the rectangular footprint 104 and the second co-layout of multilayer ceramic capacitors 108 may be surface mounted on a southwest corner of the rectangular footprint 104.

The surface mounted layout also comprises a first solid electrolytic polymer capacitor 110 and a second solid electrolytic polymer capacitor 112 mounted on the remaining corners, respectively, of the rectangular footprint 104 of the bottom side 106 of the printed circuit board 100. The first solid electrolytic polymer capacitor 110 may be an electrolytic capacitor where the electrolyte is a solid rather than a liquid type electrolyte. In one or more embodiments, the solid electrolyte may be a conductive polymer such as Poly(3,4-ethylenedioxythiophene) or PEDT. Such a capacitor may also include a cathode comprised of aluminum and/or tantalum. In this example embodiment, each of the first and second solid electrolytic polymer capacitors may have a capacitance of 330 µF and an equivalent series resistance (ESR) of 6 mΩ. Such characteristics are important for the capacitors to handle high switching operations and applications involving high ripple currents. Furthermore, each of the solid electrolytic polymer capacitors may withstand operating temperature ranges of between −40° C. and 105° C.

Figure 2:
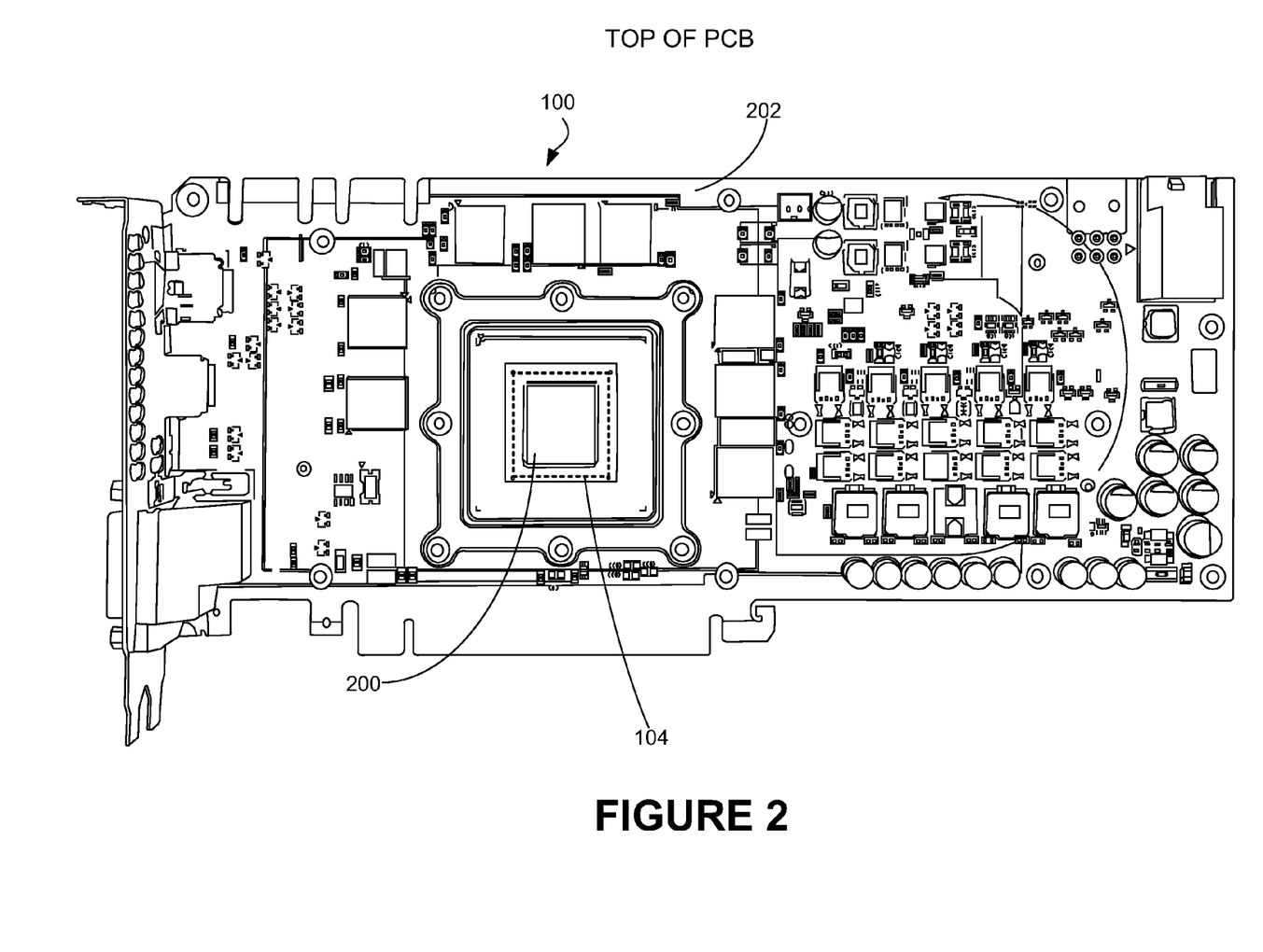
FIG. 2 depicts a top side of the printed circuit board of FIG. 1 comprising a surface mounted high-speed processing unit, according to one embodiment.

Reference is now made to FIG. 2 which depicts a top side of the printed circuit board of FIG. 1 comprising a surface mounted high-speed processing unit, according to one or more embodiments. As shown in FIG. 2, a high-speed processing unit 200 is surface mounted on a top side 202 of the printed circuit board 100 opposite that of the bottom side comprising the first co-layout of multilayer ceramic capacitors 102 and second co-layout of multiplayer ceramic capacitors 108. In this embodiment, the high-speed processing unit 200 may be a graphics processing unit (GPU) or a central processing unit (CPU). In addition, the printed circuit board 100 may be configured to be integrated into a computer graphics card, a mobile graphics card, a computer video adapter, a mobile video adapter, a computer graphics adapter, and/or a mobile graphics adapter. In one or more embodiments, the computer graphics card may be any of NVIDIA's® GeForce® line of graphics cards, including: the GTX 650® card, the GTX 660® card, the GTX 670® card, the GTX 680® card, and/or the GTX 690® card.

Figure 3:
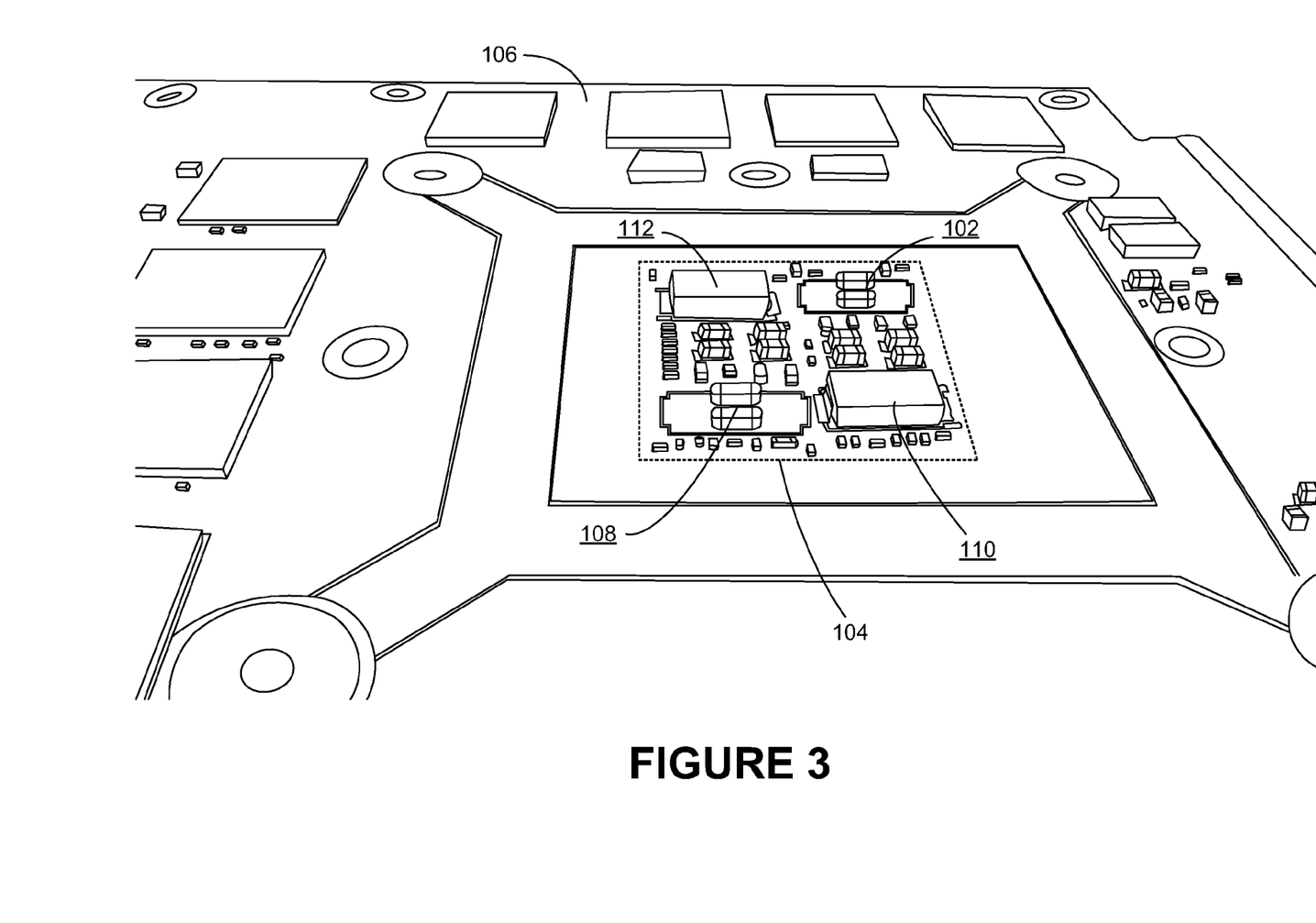
FIG. 3 is a close-up perspective view of the printed circuit board of FIG. 1 comprising a surface mounted layout to reduce voltage noise, according to one embodiment.

Reference is now made to FIG. 3, which is a close-up perspective view of the printed circuit board of FIG. 1 comprising a surface mounted layout to reduce voltage noise, according to one or more embodiments. As can be seen in FIGS. 1, 2, and 3, the rectangular footprint 104 is a footprint of the high-speed processing unit 200 of FIG. 2 mounted on the top side 202 of the printed circuit board. In this embodiment, the term "footprint" refers to a physical area occupied by an electronic component when mounted on a printed circuit board. In this embodiment, the rectangular footprint 104 may be indicated by a copper pattern etched on the printed circuit board and/or a virtual footprint that is visible only on computer-assisted drawings of the board's layout. In one embodiment, the rectangular footprint may be a footprint of the integrated circuit package containing the high-speed processing unit 200. In one or more embodiments, the rectangular footprint 104 may be substantially a square having side dimensions between 20 and 35 mm. In one embodiment, the first co-layout of multilayer ceramic capacitors 102 may be mounted on a northwest corner of the rectangular footprint 104 and the second co-layout of multilayer ceramic capacitors 108 may be mounted on a southeast corner of the rectangular footprint 104. Additionally, the first solid electrolytic polymer capacitor 110 may be mounted on a northeast corner of the rectangular footprint 104 and the second solid electrolytic polymer capacitor 112 may be mounted on a southwest corner of the rectangular footprint 104.

In another embodiment, the diagonal arrangement may be switched so that the first co-layout of multilayer ceramic capacitors 102 may be mounted on a northeast corner of the rectangular footprint 104 and the second co-layout of multilayer ceramic capacitors 108 may be mounted on a southwest corner of the rectangular footprint 104. In this alternative embodiment, the first solid electrolytic polymer capacitor 110 may be mounted on a northwest corner of the rectangular footprint 104 and the second solid electrolytic polymer capacitor 112 may be mounted on a southeast corner of the rectangular footprint 104. Arranging the capacitor sets diagonally from one another allows a board designer to locate the decoupling capacitors close to the voltage supply pins and ground pins of the high-speed processing unit 200 but does not require any of the capacitors to be located outside the confines of the rectangular footprint 104.

Moreover, the surface mounted layout of FIG. 1 and FIG. 3 allow a board designer to take advantage of the improved thermal specifications of the set of multilayer ceramic capacitors compared with those of their solid electrolytic polymer counterparts. While the multilayer ceramic capacitors used to construct the first and second co-layout of capacitors may have a maximum thermal limitation of 125° C., the solid electrolytic polymers may have a maximum thermal limitation of 105° C. When mounted directly underneath the heat-dissipating high-speed processing unit 200, it may be beneficial to maximize the distance between the two solid electrolytic polymer capacitors so as not to cause either or both of the solid electrolytic polymer capacitors to overheat and surpass the component's thermal specifications. Thus, the corner layout of FIGS. 1 and 3 allow the decoupling mechanism to take advantage of the high capacitance and low ESR of the solid electrolytic polymer capacitors while also maintaining the high thermal integrity of the multilayer ceramic capacitors.

Figure 4:
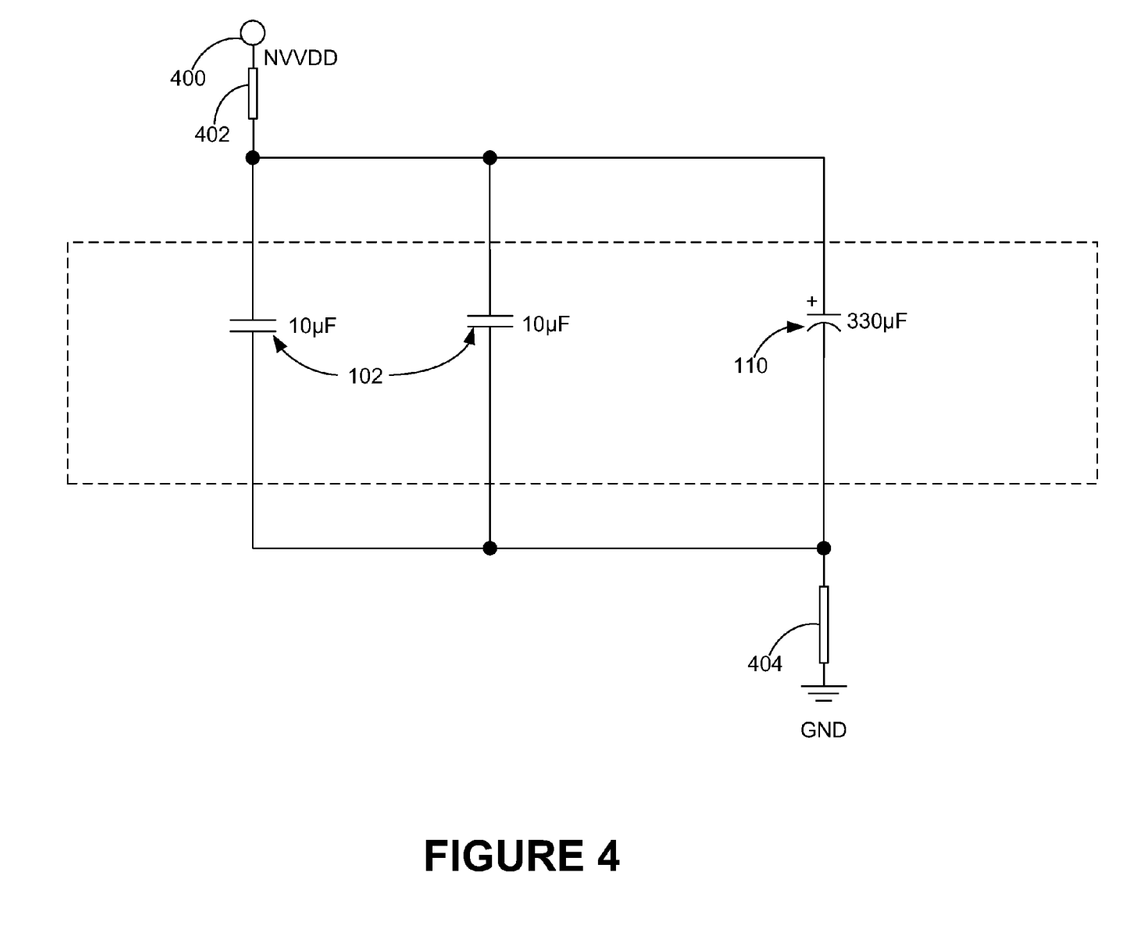
FIG. 4 is a circuit diagram depicting a portion of the surface mounted circuit layout of FIG. 1, according to one embodiment.

Reference is now made to FIG. 4, which is a circuit diagram depicting a portion of the surface mounted circuit layout of FIG. 1, according to one embodiment. In this embodiment, a set of leads of the first co-layout of multilayer ceramic capacitors 102, the first solid electrolytic polymer capacitor 110, the second co-layout of multilayer ceramic capacitors 108, and/or the second solid electrolytic polymer capacitors 112 is coupled to a voltage supply pin 402 and/or a ground pin 404 of a voltage supply 400 of the high-speed processing unit 200 through a via (see FIG. 5). The voltage supply 400 of the high-speed processing unit 200 may be a core voltage supply and the voltage may be delivered through NVVDD voltage supply lines or rails. In another embodiment, the surface mounted layout of FIG. 1 may be used to reduce voltage noise on other power lines including, but not limited to, DACVDD, PLLVDD, and FBVDD. As shown in FIG. 4, the multilayer ceramic capacitors used to construct either the first co-layout or the second co-layout of multilayer ceramic capacitors may each have a capacitance of 10 µF. In addition, the solid electrolytic polymer capacitor may have a capacitance of 330 µF. In this embodiment, the combination of two 10 µF multilayer ceramic capacitors and one 330 µF may be used to reduce voltage noise at frequencies in the range of 500-600 kHz. In another embodiment, the multilayer ceramic capacitors used to construct either the first co-layout or the second co-layout of multilayer ceramic capacitors may each have a capacitance of 47 µF with the solid electrolytic polymer capacitor maintaining its capacitance of 330 µF. In this alternative embodiment, the combination of two 47 µF multilayer ceramic capacitors and one 330 µF may be used to reduce voltage noise at frequencies in the range of 100-200 kHz.

Figure 5:
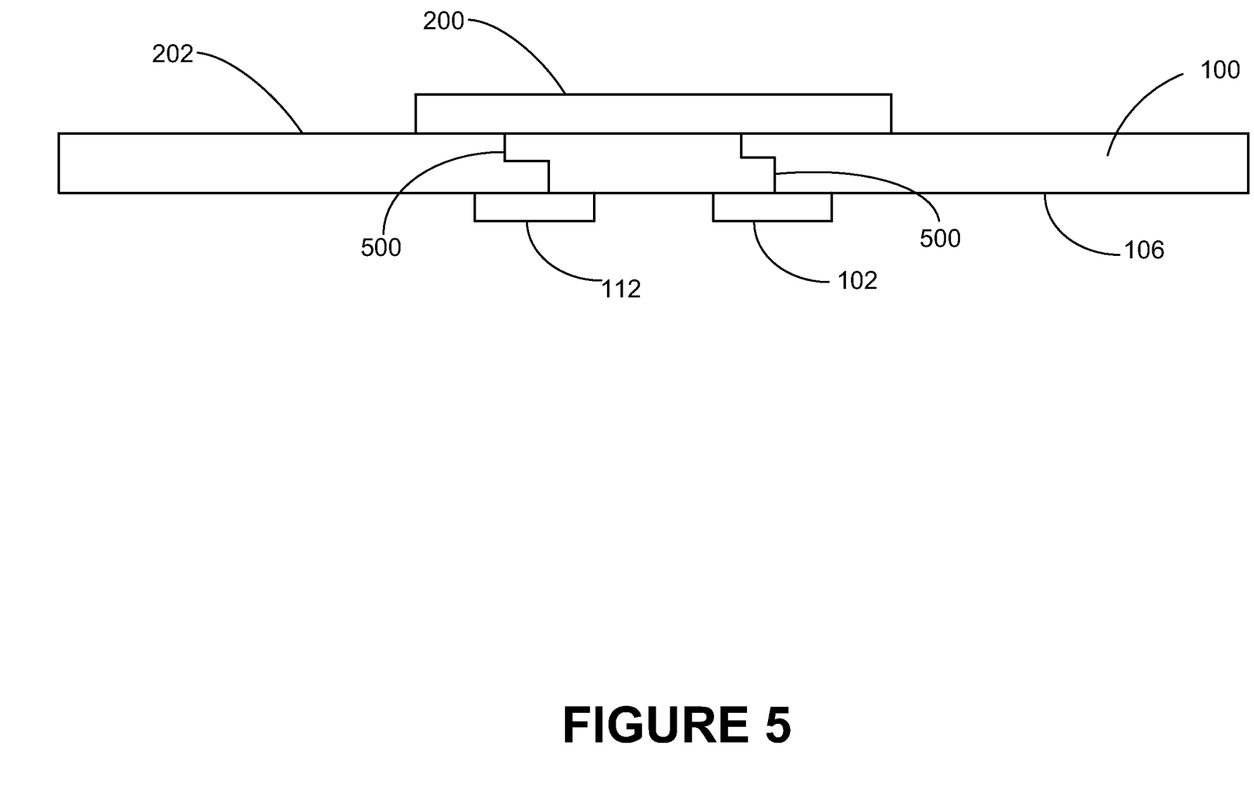
FIG. 5 is a simplified cross-sectional view depicting the orientation of the printed circuit board layout of FIG. 1, according to one embodiment.

Reference is now made to FIG. 5, which is a simplified cross-sectional view depicting the orientation of the printed circuit board layout of FIG. 1, according to one embodiment. In this embodiment, the high-speed processing unit 200 is mounted on the top side 202 of the printed circuit board and the co-layout of multilayer ceramic capacitors and the solid electrolytic polymer capacitors are mounted on the bottom side 106 of the printed circuit board 100 directly underneath the high speed processing unit 200. This layout is preferred because the high-speed and high-current nature of logic integrated circuits such as GPUs require capacitors that serve a decoupling purpose to be located in close proximity to the voltage supply pins of such integrated circuits. Since the inductance of the lead-out wires within an IC package often is significant in such cases, the voltage supply and ground pins of the high performance IC must be located in a tight configuration around the chip package. In this case, both the leads of the co-layout of multilayer ceramic capacitors and the solid electrolytic capacitors may be limited to one or more vias 500 between the various circuit layers. In the present embodiment, both the first co-layout of multilayer ceramic capacitors 102 and the second co-layout of multilayer ceramic capacitors 108 and the first and second solid electrolytic polymer capacitors (110 and 112) are mounted within the rectangular footprint 104 of the high-speed processing unit 200. Moreover, the diagonal arrangement of such capacitors allows for improved connections between the leads of the capacitors and the various supply and ground pins of the high-speed processor.

Figure 6:
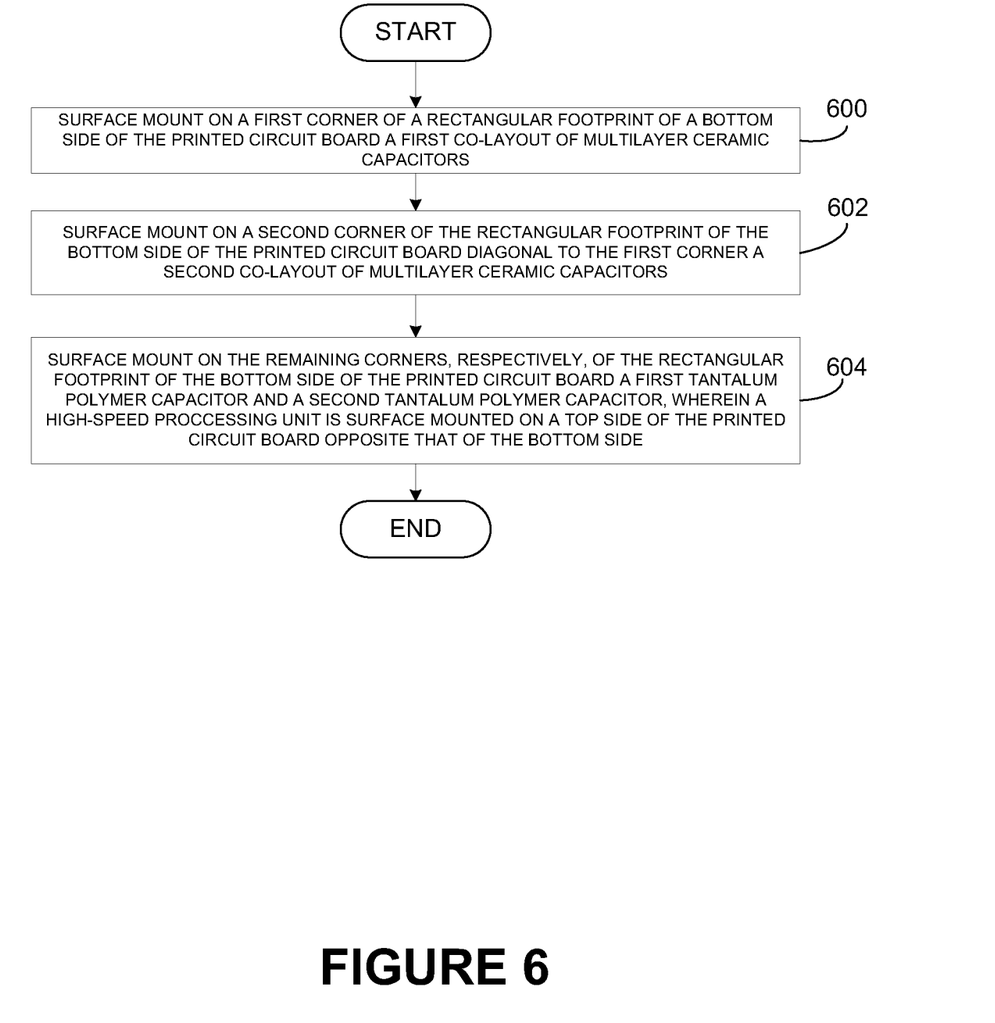
FIG. 6 is a process flow diagram illustrating a method of reducing voltage noise carried by voltage supply lines on a printed circuit board, according to one embodiment.

FIG. 6 is a process flow diagram illustrating a method of reducing voltage noise carried by voltage supply lines (e.g., NVVDD rails) on a printed circuit board, according to one embodiment. In one embodiment, operation 600 may involve surface mounting a first co-layout of multilayer ceramic capacitors 102 on a first corner of a rectangular footprint 104 of a bottom side 106 of the printed circuit board 100. The first co-layout of multilayer ceramic capacitors 102 may be mounted on the printed circuit board 100 using any commonly developed surface mounted soldering techniques, including reflow soldering. In addition, operation 602 may involve surface mounting a second co-layout of multilayer capacitors 108 on a second corner of the rectangular footprint 104 of the bottom side 106 of the printed circuit board 100. The second corner of the rectangular footprint of the printed circuit board may be substantially diagonal to the first corner of the rectangular footprint of the printed circuit board. Furthermore, operation 604 may involve surface mounting a first solid electrolytic polymer capacitor 110 and a second solid electrolytic polymer capacitor 112 on the remaining corners, respectively, of the rectangular footprint 104 of the bottom side 106 of the printed circuit board 100. In this embodiment, a high-speed processing unit 200 is surface mounted on a top side 202 of the printed circuit board 100 opposite that of the bottom side 106.

Although the present embodiments have been described with reference to specific example embodiments, it will be evident that various modifications and changes may be made to these embodiments without departing from the broader spirit and scope of the various embodiments. For example, the surface mounted layout may be expressed as an electronic assembly comprising the surface mounted layout and both the surface mounted layout and the electronic assembly may be integrated into any of a computer graphics card, a mobile graphics card, a computer video adapter, a mobile video adapter, a computer graphics adapter, and/or a mobile graphics adapter.

What is claimed is:

1. A surface mounted layout to reduce voltage noise on a printed circuit board, comprising:
   a first co-layout of multilayer ceramic capacitors mounted on a first corner of a rectangular footprint of a bottom side of the printed circuit board;
   a second co-layout of multilayer ceramic capacitors mounted on a second corner of the rectangular footprint of the bottom side of the printed circuit board diagonal to the first corner; and
   a first solid electrolytic polymer capacitor and a second solid electrolytic polymer capacitor mounted on the remaining corners, respectively, of the rectangular footprint of the bottom side of the printed circuit board,
   wherein the rectangular footprint of the printed circuit board is a footprint of a high-speed processing unit mounted on the printed circuit board, and
   wherein the high-speed processing unit is mounted on a top side of the printed circuit board opposite the bottom side comprising the first co-layout of multilayer ceramic capacitors and the second co-layout of multilayer ceramic capacitors, and
   wherein a set of leads of at least one of the first co-layout of multilayer ceramic capacitors, the first solid electrolytic polymer capacitor, the second co-layout of multilayer ceramic capacitors, and the second solid electrolytic polymer capacitor is coupled to at least one of a voltage supply pin and a ground pin of a voltage supply of the high-speed processing unit through a via.

2. The surface mounted layout of claim 1, wherein the high-speed processing unit is at least one of a central processing unit (CPU) and a graphics processing unit (GPU).

3. The surface mounted layout of claim 1, wherein the voltage supply of the high-speed processing unit is at least one of an NVVDD and a core voltage of the high-speed processing unit.

4. The surface mounted layout of claim 1, wherein the rectangular footprint is substantially a square having a side dimension between 20 and 35 mm.

5. The surface mounted layout of claim 1, wherein a set of thermal performance limitations for each of the multilayer ceramic capacitors is between −55° C. and 125° C. and a set of thermal performance limitations for each of the first solid electrolytic polymer capacitor and the second solid electrolytic polymer capacitor is between −40° C. and 105° C.

6. The surface mounted layout of claim 1, wherein each of the multilayer ceramic capacitors has a capacitance of 10 µF.

7. The surface mounted layout of claim 1, wherein each of the multilayer ceramic capacitors has a capacitance of 47 µF.

8. The surface mounted layout of claim 1, wherein the printed circuit board is configured to be integrated into at least one of a computer graphics card, a mobile graphics card, a computer video adapter, a mobile video adapter, a computer graphics adapter, and a mobile graphics adapter.

9. An electronic assembly to reduce voltage noise, comprising:
   a first co-layout of multilayer ceramic capacitors surface mounted on a first corner of a rectangular footprint of a bottom side of the printed circuit board;
   a second co-layout of multilayer ceramic capacitors surface mounted on a second corner of the rectangular footprint of the bottom side of the printed circuit board diagonal to the first corner; and a first solid electrolytic polymer capacitor and a second solid electrolytic polymer capacitor surface mounted on the remaining corners, respectively, of the rectangular footprint of the bottom side of the printed circuit board, wherein the rectangular footprint of the printed circuit board is a footprint of a high-speed processing unit mounted on the printed circuit board, wherein the high-speed processing unit is surface mounted on a top side of the printed circuit board opposite that of the bottom side comprising the first co-layout of multilayer ceramic capacitors and the second co-layout of multilayer ceramic capacitors, and wherein a set of leads of at least one of the first co-layout of multilayer ceramic capacitors, the first solid electrolytic polymer capacitor, the second co-layout of multilayer ceramic capacitors, and the second solid electrolytic polymer capacitor is coupled to at least one of a voltage supply pin and a ground pin of a voltage supply of the high-speed processing unit through a via.

10. The electronic assembly of claim 9, wherein the high-speed processing unit is at least one of a central processing unit (CPU) and a graphics processing unit (GPU).

11. The electronic assembly of claim 9, wherein the voltage supply of the high-speed processing unit is at least one of an NVVDD and a core voltage of the high-speed processing unit.

12. The electronic assembly of claim 9, wherein the rectangular footprint is substantially a square having a side dimension between 20 and 35 mm.

13. The electronic assembly of claim 9, wherein a set of thermal performance limitations for each of the multilayer ceramic capacitors is between −55° C. and 125° C. and a set of thermal performance limitations for each of the first solid electrolytic polymer capacitor and the second solid electrolytic polymer capacitor is between −40° C. and 105° C.

14. The electronic assembly of claim 9, wherein each of the multilayer ceramic capacitors has a capacitance of 10 μF.

15. The electronic assembly of claim 9, wherein each of the multilayer ceramic capacitors has a capacitance of 47 μF.

16. The electronic assembly of claim 9, wherein the printed circuit board is configured to be integrated into at least one of a computer graphics card, a mobile graphics card, a computer video adapter, a mobile video adapter, a computer graphics adapter, and a mobile graphics adapter.

17. A method of assembling a printed circuit board to reduce voltage noise, comprising:

surface mounting on a first corner of a rectangular footprint of a bottom side of the printed circuit board a first co-layout of multilayer ceramic capacitors;

surface mounting on a second corner of the rectangular footprint of the bottom side of the printed circuit board diagonal to the first corner a second co-layout of multilayer ceramic capacitors; and surface mounting on the remaining corners, respectively, of the rectangular footprint of the bottom side of the printed circuit board a first solid electrolytic polymer capacitor and a second solid electrolytic polymer capacitor, wherein the rectangular footprint of the printed circuit board is a footprint of a high-speed processing unit mounted on the printed circuit board, wherein the high-speed processing unit is surface mounted on a top side of the printed circuit board opposite the bottom side comprising the first co-layout of multilayer ceramic capacitors and the second co-layout of multilayer ceramic capacitors, wherein a set of leads of at least one of the first co-layout of multilayer ceramic capacitors, the first solid electrolytic polymer capacitor, the second co-layout of multilayer ceramic capacitors, and the second solid electrolytic polymer capacitor is coupled to at least one of a voltage supply pin and a ground pin of a voltage supply of the high-speed processing unit through a via, and wherein the voltage supply of the high-speed processing unit is at least one of an NVVDD and a core voltage of the high-speed processing unit.

18. The method of claim 17, wherein the high-speed processing unit is at least one of a central processing unit (CPU) and a graphics processing unit (GPU) and the rectangular footprint is substantially a square having a side dimension between 20 and 35 mm.

19. The method of claim 17, wherein a set of thermal performance limitations for each of the multilayer ceramic capacitors is between −55° C. and 125° C. and a set of thermal performance limitations for each of the first solid electrolytic polymer capacitor and the second solid electrolytic polymer capacitor is between −40° C. and 105° C. and each of the multilayer ceramic capacitors has a capacitance of 47 μF.

20. The method of claim 17, wherein the printed circuit board is configured to be integrated into at least one of a computer graphics card, a mobile graphics card, a computer video adapter, a mobile video adapter, a computer graphics adapter, and a mobile graphics adapter.

\* \* \* \* \*